United States Patent
Nakamura et al.

(10) Patent No.: US 12,038,275 B2
(45) Date of Patent: Jul. 16, 2024

(54) POWER GENERATION ELEMENT, AND MAGNETIC SENSOR, ENCODER, AND MOTOR USING THE SAME

(71) Applicant: Mitsubishi Electric Corporation, Tokyo (JP)

(72) Inventors: Yoshitomo Nakamura, Tokyo (JP); Shinichiro Yoshida, Tokyo (JP); Hisanori Torii, Tokyo (JP); Masanori Nimura, Tokyo (JP); Shizuka Ueda, Tokyo (JP); Yuji Kubo, Tokyo (JP); Takuya Noguchi, Tokyo (JP); Akira Yokoyama, Tokyo (JP); Takeshi Musha, Tokyo (JP); Yoshinori Miyamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 167 days.

(21) Appl. No.: 17/800,242

(22) PCT Filed: Mar. 23, 2021

(86) PCT No.: PCT/JP2021/011846
§ 371 (c)(1),
(2) Date: Aug. 17, 2022

(87) PCT Pub. No.: WO2021/200361
PCT Pub. Date: Oct. 7, 2021

(65) Prior Publication Data
US 2023/0068474 A1    Mar. 2, 2023

(30) Foreign Application Priority Data

Apr. 1, 2020 (JP) .................. 2020-065516

(51) Int. Cl.
*G01B 7/30* (2006.01)
*G01D 5/20* (2006.01)
(Continued)

(52) U.S. Cl.
CPC .................. *G01B 7/30* (2013.01); *G01D 5/20* (2013.01); *H02K 1/02* (2013.01); *H02K 3/04* (2013.01); *H02K 11/20* (2016.01)

(58) Field of Classification Search
CPC ... G01B 7/30; G01D 5/20; H02K 1/02; H02K 3/04; H02K 11/20; H02K 11/215;
(Continued)

(56) References Cited

U.S. PATENT DOCUMENTS 5,181,020 A * 1/1993 Furukawa ............. H01F 1/0304
                                                              204/192.1
9,494,556 B2 * 11/2016 May .......................... G01L 1/12
(Continued)

FOREIGN PATENT DOCUMENTS

CN        102447326 A  *  5/2012
EP        3082236 A1  * 10/2016  ............... H02K 1/02
(Continued)

OTHER PUBLICATIONS

Y. Takemura, N. Fujinaga, A. Takebuchi and T. Yamada, "Battery-less Hall Sensor Operated by Energy Harvesting From a Single Wiegand Pulse," in IEEE Transactions on Magnetics, vol. 53, No. 11, pp. 1-6, Nov. 2017, Art No. 4002706, doi: 10.1109/TMAG.2017.2713837. (Year: 2017).*

(Continued)

*Primary Examiner* — Tung X Nguyen
*Assistant Examiner* — Robert P Alejnikov, Jr.
(74) *Attorney, Agent, or Firm* — BUCHANAN INGERSOLL & ROONEY PC

(57) ABSTRACT

The present disclosure includes: a magnetic member configured to cause a large Barkhausen effect; a power genera-
(Continued)

tion coil disposed so as to be wound around the magnetic member; and soft magnetic members formed at both end portions of the magnetic member so as to be in contact with the magnetic member and so as to press the magnetic member. Consequently, evenness of a magnetic flux density inside the magnetic member is increased, and the large Barkhausen effect is stably caused, whereby a highly stable power generation element is obtained.

20 Claims, 15 Drawing Sheets

(51) Int. Cl.
    *H02K 1/02*       (2006.01)
    *H02K 3/04*       (2006.01)
    *H02K 11/20*     (2016.01)

(58) Field of Classification Search
    CPC ..... H02K 11/0094; H02K 11/22; G01P 3/486; G01R 33/02; H03K 3/45
    USPC .................................................. 324/207.16
    See application file for complete search history.

(56) References Cited

U.S. PATENT DOCUMENTS

| | | | |
|---|---|---|---|
| 2010/0045119 A1* | 2/2010 | Jackson | ............... F03G 5/061 310/20 |
| 2010/0156406 A1* | 6/2010 | Ueda | ............... G01N 27/745 324/258 |
| 2016/0308411 A1 | 10/2016 | Watanabe et al. | |
| 2017/0276820 A1* | 9/2017 | Adachi | ............... G01V 3/104 |
| 2019/0319524 A1* | 10/2019 | Ueno | ............... H02K 35/02 |

FOREIGN PATENT DOCUMENTS

| | | | | |
|---|---|---|---|---|
| JP | S5450373 | A | | 4/1979 |
| JP | 2006073974 | A | | 3/2006 |
| JP | 2014-171044 | A | | 9/2014 |
| JP | 2016208817 | A | | 12/2016 |
| JP | 6647478 | B1 | * | 2/2020 |
| JP | 6647478 | B1 | | 2/2020 |
| WO | WO-2014089817 | A1 | * | 6/2014 ............ H01F 7/021 |

OTHER PUBLICATIONS

Notice of Reasons for Refusal dated Jul. 11, 2023, issued in the corresponding Japanese Patent Application No. 2022-511970, 10 pages including 5 pages of English Translation.

* cited by examiner (a)

(b)

POWER GENERATION ELEMENT, AND MAGNETIC SENSOR, ENCODER, AND MOTOR USING THE SAME

TECHNICAL FIELD

The present disclosure relates to a power generation element, and a magnetic sensor, an encoder, and a motor using the same.

BACKGROUND ART

The large Barkhausen effect is a phenomenon in which a magnetization direction is abruptly reversed according to a change in an external magnetic field.

It is possible to obtain a power generation element in which: a power generation coil made of an electrically conductive wire is provided around a magnetic member which causes the large Barkhausen effect; and, when an external magnetic field is applied such that a magnetization direction is reversed by the large Barkhausen effect, electromotive force is generated in the power generation coil owing to electromagnetic induction.

If soft magnetic members are disposed at both end portions of the magnetic member composing the power generation element, demagnetizing fields generated at the ends of the magnetic member are weakened. Thus, evenness of magnetic flux generated in the magnetic member can be increased. As a result, the large Barkhausen effect can be stably caused regardless of the strength and the polarity of the magnetic field applied from outside, whereby power generation characteristics that experience little fluctuation can be obtained (for example, Patent Document 1).

CITATION LIST

Patent Document

Patent Document 1: Japanese Laid-Open Patent Publication No. 2006-73974

SUMMARY OF THE INVENTION

Problems to be Solved by the Invention

Patent Document 1 indicates that provision of the soft magnetic members at both end portions of the magnetic member makes it possible to reduce influence of demagnetizing fields generated at the ends of the magnetic member and obtain stable power generation characteristics.

However, the following problem arises. That is, attachment of the soft magnetic members to the magnetic member is generally performed by forming through holes in the soft magnetic members and inserting the magnetic member thereinto, and, if the inner diameter defined by each hole and the outer diameter of the magnetic member are uneven, a magnetic resistance based on the gap between the soft magnetic member and the magnetic member fluctuates. Consequently, magnetic fluxes generated in the magnetic member become unstable, and the stabilities of the power generation characteristics are also reduced.

The present disclosure has been made to solve the above problem, and an object of the present disclosure is to provide a power generation element in which the large Barkhausen effect is stably caused by a magnetic member and which has highly stable power generation characteristics.

Solution to the Problems

A power generation element according to the present disclosure includes: a magnetic member configured to cause a large Barkhausen effect; a power generation coil disposed so as to be wound around the magnetic member; and soft magnetic members formed at both end portions of the magnetic member so as to be in contact with the magnetic member and so as to press the magnetic member.

Effect of the Invention

The power generation element according to the present disclosure makes it possible to obtain a highly stable power generation element in which the large Barkhausen effect is stably caused by the magnetic member.

DESCRIPTION OF EMBODIMENTS

Figure 1:
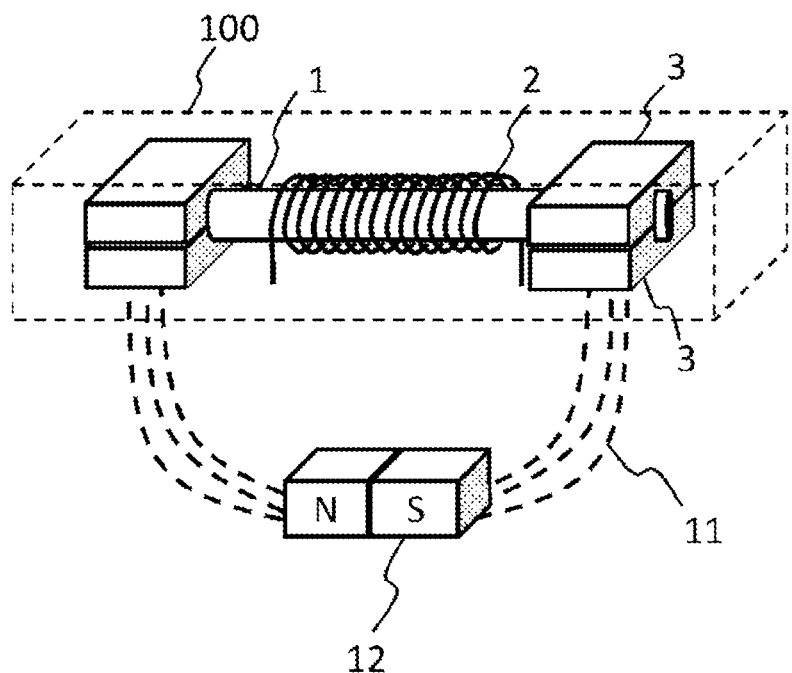
FIG. 1 is a schematic view showing a configuration of a power generation element according to embodiment 1.

The same or corresponding portions in descriptions of embodiments and the drawings are denoted by the same reference characters.

Embodiment 1

A power generation element according to embodiment 1 will be described with reference to FIG. 1 to FIG. 16.

<Configuration of Power Generation Element>

FIG. 1 shows a configuration of a power generation element 100 according to the present embodiment 1.

A power generation coil 2 made of an electrically conductive wire is wound around a magnetic member 1, and soft magnetic members 3 each made of a soft magnetic material are disposed at both end portions of the magnetic member 1 in a state where: the soft magnetic members 3 are in contact with the periphery of the magnetic member 1; and the magnetic member 1 is sandwiched therebetween so as to be pressed.

A magnetic field generation source 12 which is exemplified by a magnet and which applies magnetic fields to the magnetic member 1, is disposed near the magnetic member 1, and magnetic fields 11 are generated in the surroundings.

The magnetic member 1 used in the present embodiment 1 can cause the large Barkhausen effect. The large Barkhausen effect is a phenomenon in which domain walls inside the magnetic member 1 move at once at the time of magnetization of the magnetic member 1 so that a magnetization direction is reversed in a very short time.

As the magnetic member 1 which causes the large Barkhausen effect, vicalloy (Fe—Co—V alloy) can be used. To cause the large Barkhausen effect, the magnetic member 1 needs to be configured to have different coercivities between an outer peripheral portion thereof and a center portion thereof by controlling an internal stress distribution and a composition distribution.

Considering this, vicalloy is drawn into the shape of a wire of 0.1 mm to 1 mm and then twisted so that a magnetic member 1 configured to have different coercivities between the outer peripheral portion and the center portion is obtained.

The power generation coil 2 is made of an electrically conductive wire and disposed so as to be wound around and enclose the magnetic member 1.

If a magnetic flux inside the magnetic member 1 is changed by the large Barkhausen effect of the magnetic member 1, a magnetic flux passing through the power generation coil 2 is changed. Therefore, an electromotive force is generated in the power generation coil 2 owing to electromagnetic induction, and functioning as the power generation element 100 can be achieved.

For the power generation coil 2 made of an electrically conductive wire, a copper wire with an insulation coating thereon can be used and is formed by winding a wire material around a bobbin.

The wire diameter of the power generation coil 2 is 0.02 mm to 0.05 mm.

The magnetic field generation source 12 is disposed at a location near the magnetic member 1.

Two magnetic poles which are an N pole and an S pole are used as the magnetic field generation source 12, to generate magnetic fields 11. One or more sets each composed of the two magnetic poles which are the N pole and the S pole can also be used as the magnetic field generation source 12, to generate magnetic fields 11. The magnetic fields 11 are applied to the magnetic member 1.

At each of both end portions of the magnetic member 1, corresponding ones of the soft magnetic member 3 are disposed.

The soft magnetic members 3 easily experience magnetic pole reversal or the like and each have a higher magnetic permeability and a higher saturation magnetic flux density than the magnetic member 1 used in the present embodiment 1.

Figure 2:
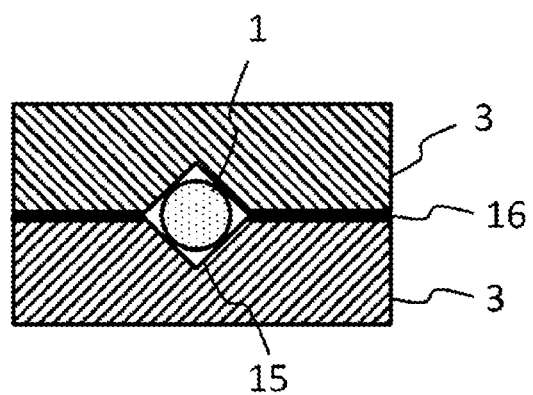
FIG. 2 is a cross-sectional view of soft magnetic members in embodiment 1.

FIG. 2 is a cross-sectional view, taken in a direction perpendicular to the magnetic member 1, of a portion at which the soft magnetic members 3 are attached to the magnetic member 1.

As shown in the schematic view in FIG. 1 and the cross-sectional view in FIG. 2, grooves 15 each having a V-shaped cross section are formed in the soft magnetic members 3 each having the shape of a block. The magnetic member 1 is held in a state of being fitted into the V-shaped grooves 15 so as to be located at a predetermined position and being pressed by the two soft magnetic members 3 from above and below, i.e., a state where wall surfaces of the V-shaped grooves 15 formed in the soft magnetic members 3 are pressing the magnetic member 1.

Each groove 15 formed in the corresponding soft magnetic member 3 having the shape of a block has a depth larger than the radius of the magnetic member 1. In the present embodiment 1, the groove 15 is formed so as to have a depth larger, at most by 0.2 mm, than a depth equal to the radius of the magnetic member 1 and is used. A groove shaped so as to define an inner diameter smaller than the outer diameter of the magnetic member 1 is formed in the soft magnetic member 3 such that the wall surface of the groove 15 presses the magnetic member 1.

The two soft magnetic members 3 each having the shape of a block face each other, and surfaces of the soft magnetic members 3 that face each other and that are not the portions in which the grooves 15 are formed, are in contact with each other. An adhesive 16 is applied and cured on the surfaces in contact with each other, whereby the state where the magnetic member 1 is pressed is maintained.

<Advantageous Effects of Soft Magnetic Members>

Figure 3:
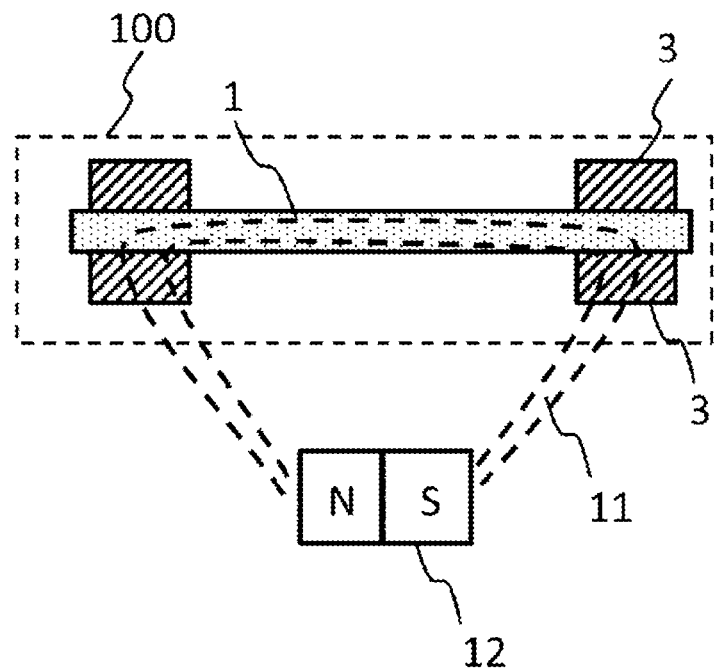
FIG. 3 is a schematic cross-sectional view of a power generation element according to embodiment 1.
Figure 4:
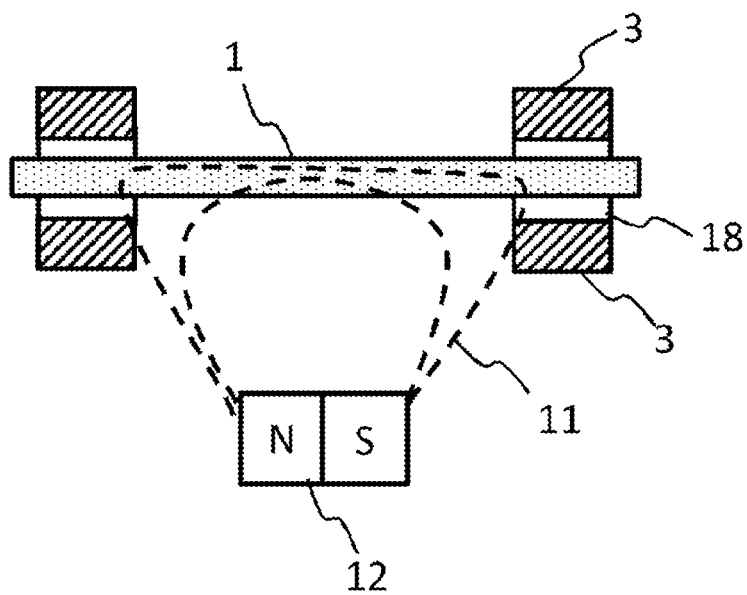
FIG. 4 is a schematic cross-sectional view of a power generation element according to embodiment 1.
Figure 5:
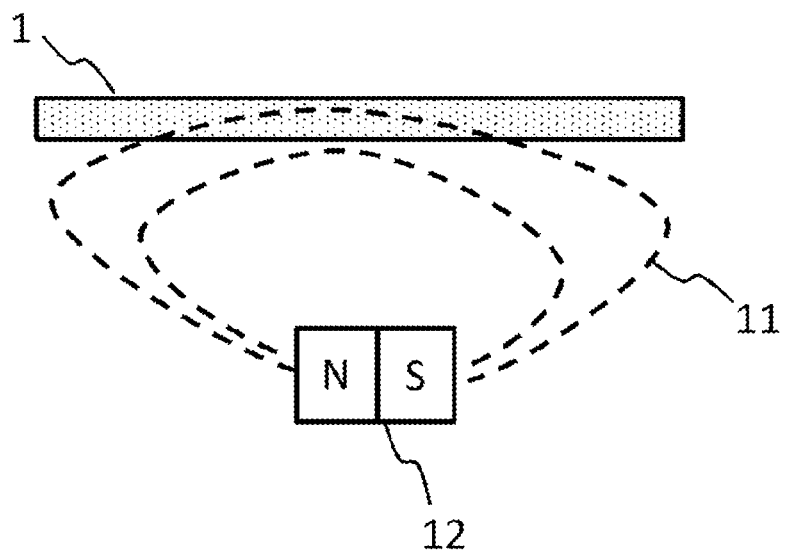
FIG. 5 is a schematic cross-sectional view of a power generation element according to embodiment 1.

FIG. 3 to FIG. 5 are schematic cross-sectional views of power generation elements 100, taken in the longitudinal directions of respective magnetic members 1. FIG. 3 to FIG. 5 show how magnetic fields generated from magnetic field generation sources 12 are distributed inside the respective magnetic members 1. FIG. 3 is a schematic cross-sectional view of a power generation element 100 in which soft magnetic members 3 are disposed so as to press and be in contact with both end portions of the magnetic member 1. FIG. 5 is a schematic cross-sectional view of a power generation element 100 in the case where no soft magnetic members 3 are provided at both end portions of the magnetic member 1.

FIG. 4 shows a configuration that is intermediate between FIG. 3 to FIG. 5, and shows a state where, although soft magnetic members 3 are provided at both end portions of the magnetic member 1, the magnetic member 1 is not pressed against each soft magnetic member 3 but is disposed with a gap 18 therebetween. In FIG. 3 to FIG. 5, no power generation coil 2 is shown.

Figure 6:
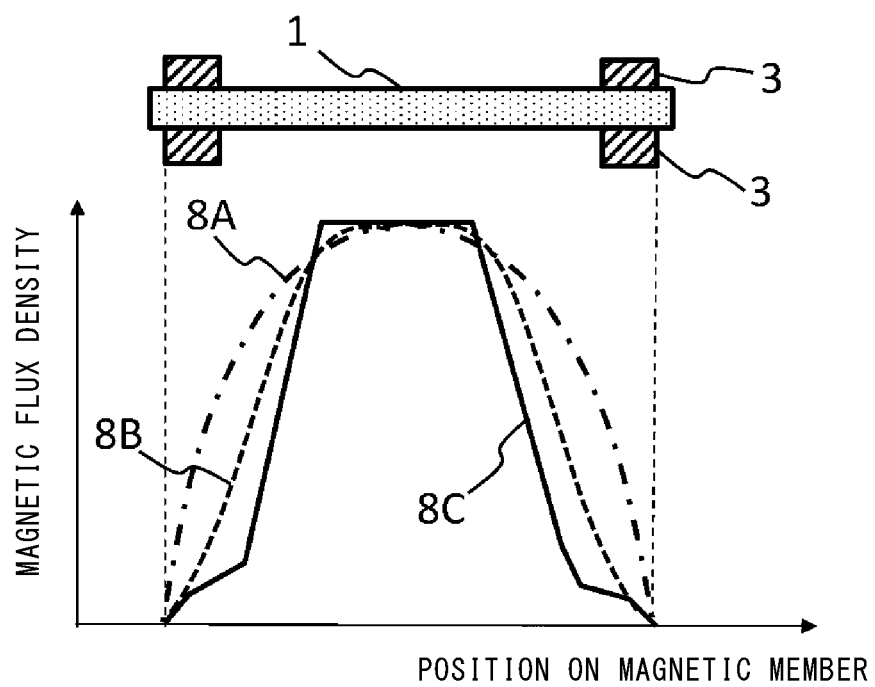
FIG. 6 illustrates magnetic flux densities inside a magnetic member in embodiment 1.
Figure 7:
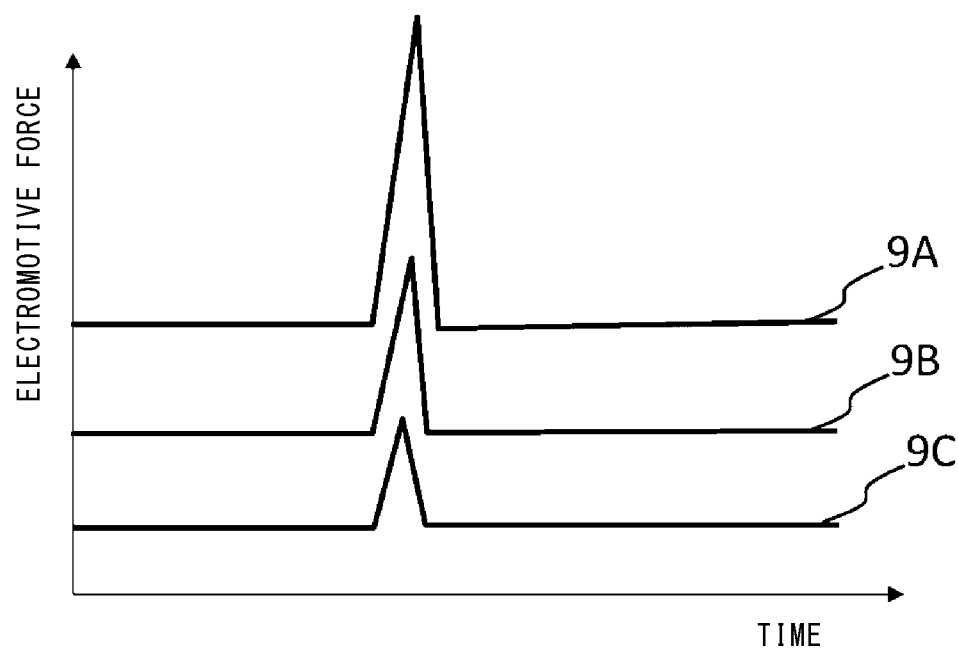
FIG. 7 illustrates electromotive forces of the power generation element according to embodiment 1.
Figure 8:
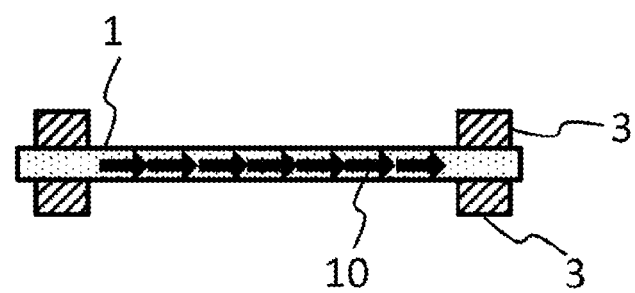
FIG. 8 is a diagram for explaining a distribution of a magnetic flux density inside the magnetic member in embodiment 1.
Figure 9:
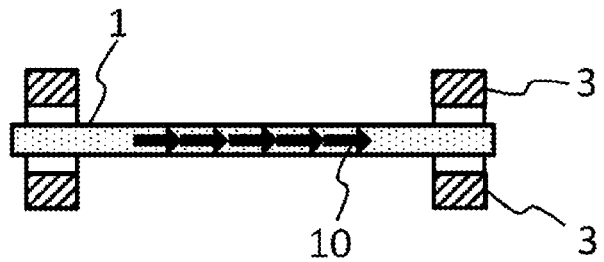
FIG. 9 is a diagram for explaining a distribution of a magnetic flux density inside the magnetic member in embodiment 1.
Figure 10:
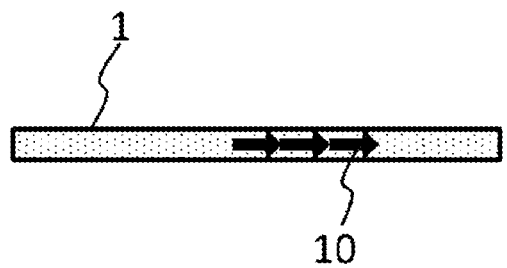
FIG. 10 is a diagram for explaining a distribution of a magnetic flux density inside the magnetic member in embodiment 1.

FIG. 6 shows distributions of magnetic flux densities inside the magnetic members 1 of the power generation elements 100 shown in FIG. 3 to FIG. 5. FIG. 7 shows electromotive forces at the respective magnetic flux densities. FIG. 8 to FIG. 10 show, by arrows 10, regions in which the magnetic flux densities inside the respective magnetic members 1 are high.

In the case where a state where the magnetic flux density is equal between the soft magnetic members 3 disposed at both end portions of the magnetic member 1 is evaluated as being even, and a state where the magnetic flux density is not equal therebetween is evaluated as being uneven, the magnetic member 1 can be said to be substantially entirely even in FIG. 3 showing the power generation element 100 in which the soft magnetic members 3 are disposed at both end portions of the magnetic member 1 so as to press the magnetic member 1. Meanwhile, it is seen that the range in which magnetic fields are formed evenly is narrow in FIG. 4 showing the power generation element 100 in which each soft magnetic member 3 does not press the magnetic member 1 but is disposed with a gap therebetween. Further, it is seen that evenness of magnetic fields inside the magnetic member 1 is significantly reduced in the power generation element 100 shown in FIG. 5 in which no soft magnetic members 3 are used.

FIG. 6 shows distributions of the magnetic flux densities inside the magnetic members 1 of the three types of power generation elements 100 shown in FIG. 3 to FIG. 5 such that the distributions are compared with one another. FIG. 6 shows: a magnetic flux density 8A inside the magnetic member 1 on which the soft magnetic members 3 are disposed so as to press the magnetic member 1; a magnetic flux density 8B in the case where the magnetic member 1 is not pressed against the soft magnetic members 3 but is disposed with a gap therebetween; and a magnetic flux density 8C in the case where no soft magnetic members 3 are used.

In FIG. 6, a cross-sectional view of the magnetic member 1 and the soft magnetic members 3 is shown in the upper part of the drawing correspondingly to data of the magnetic flux densities in order to facilitate understanding of the positional relationship between the magnetic member 1 and the distributions of the magnetic flux densities.

In the case where no soft magnetic members 3 are used, the magnetic flux density is high at a center portion of the magnetic member 1, but, outside the center portion, the magnetic flux density has been rapidly reduced toward both end portions, as indicated by the magnetic flux density 8C. Meanwhile, in the case of the configuration in which each soft magnetic members 3 does not press the magnetic member 1 but is disposed with a gap therebetween, the range in which the magnetic flux density is high is wider than that of magnetic flux density 8C in the configuration in which no soft magnetic members 3 are used, but the magnetic flux density has been rapidly reduced at both end portions of the magnetic member 1, as indicated by the magnetic flux density 8B.

It is seen that, regarding the magnetic flux density 8A in the configuration in which the magnetic member 1 is pressed against the soft magnetic members 3, the region in which the magnetic flux density is high is wider than those of the magnetic flux densities 8B and 8C in the configurations which are different in terms of presence/absence of, and the manner of disposing, the soft magnetic members 3.

FIG. 7 shows electromotive forces in the case where the distributions of the magnetic flux densities inside the magnetic members 1 correspond to the magnetic flux densities 8A to 8C shown in FIG. 6. The magnetic flux density 8A corresponds to an electromotive force 9A, the magnetic flux density 8B corresponds to an electromotive force 9B, and the magnetic flux density 8C corresponds to an electromotive force 9C.

It can be confirmed that the greatest electromotive force 9A is generated at the magnetic flux density 8A having the widest region in which the magnetic flux density is high.

Regarding the three configurations which are different in terms of presence/absence of, and the manner of disposing, the soft magnetic members 3, FIG. 8 to FIG. 10 schematically show, by the arrows 10, portions in each of which: the magnetic flux density inside the magnetic member 1 is high; and the magnetization direction is reversed by the large Barkhausen effect.

FIG. 8 shows the configuration in which the magnetic member 1 is disposed so as to be pressed by the soft magnetic members 3, the schematic cross-sectional view of the configuration being shown in FIG. 3. In FIG. 8, the arrows 10 are drawn in a wide range extending substantially over the entire magnetic member 1. Thus, FIG. 8 indicates that reversal of the magnetization direction due to the large Barkhausen effect stably occurs over the entire magnetic member 1. Therefore, in the power generation element having this configuration, the electromotive force of the power generation coil 2 generated owing to electromagnetic induction is stabilized and increased.

FIG. 9 shows the configuration shown in FIG. 4 in which a gap is present between the magnetic member 1 and each soft magnetic member 3. FIG. 10 shows the configuration shown in FIG. 5 in which no soft magnetic members 3 are used. In each of FIG. 9 and FIG. 10, the arrows 10 are distributed only in a part of the magnetic member 1 as compared to FIG. 8 so that the large Barkhausen effect is generated only at the part of the magnetic member 1. Therefore, it is found that: reversal of the magnetization direction is destabilized; and sufficient power generation characteristics of the power generation element 100 cannot be obtained.

<Other Configurations and Materials for Power Generation Element>

Configurations and materials that can be used for the power generation element 100 according to the present embodiment 1 other than the configurations and the materials described above, will be collectively described.

Instead of vicalloy, permalloy (Ni—Fe alloy), amorphous alloy, or the like can be used for the magnetic member 1 in the present embodiment 1. Further, in addition to drawing and twisting, bending, heating, and surface treatment such as plating and chemical treatment can be performed for controlling the coercivity.

The coercivity can be controlled also by adding an additive to these alloy materials.

Figure 11:
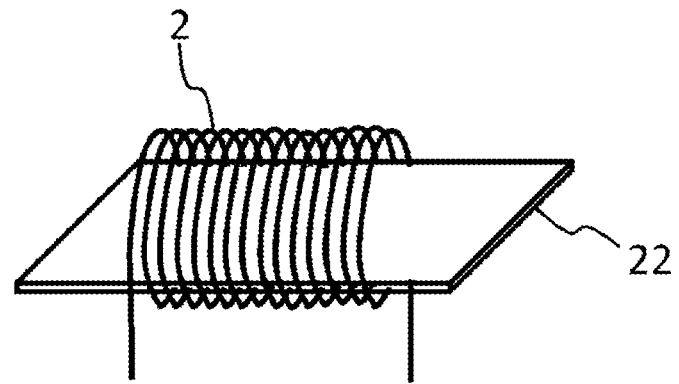
FIG. 11 is a diagram for explaining a magnetic member in embodiment 1.

Although the shape of the magnetic member 1 is the shape of a wire in the present embodiment 1, a magnetic member 22 having the shape of a sheet can also be used with the power generation coil 2 being wound therearound as shown in FIG. 11.

Although the magnetic member 1 having a wire diameter of 0.1 mm to 1 mm has been used, the wire diameter is not limited thereto. A magnetic member 1 having a wire diameter smaller than 0.1 mm and a magnetic member 1 having a wire diameter larger than 1 mm can also be used. Further, although the magnetic member 1 having a cross section with a circular shape has been used in the present embodiment 1, the cross-sectional shape is not limited thereto. A magnetic member 1 having a cross section with a polygonal shape such as a quadrangular shape, the shape of a thin flat sheet, or the like, can also be used.

Furthermore, although the magnetic member 1 configured to have a smaller coercivity at the outer peripheral portion thereof than at the center portion thereof has been used, the coercivity only has to differ between the outer peripheral portion and the center portion, and a magnetic member 1 configured to have a larger coercivity at the outer peripheral portion can also be used in the same manner.

As the material used for each soft magnetic member 3, a cold rolled steel sheet is suitable since a cold rolled steel sheet can be accurately processed into a desired shape and is inexpensive. The soft magnetic member 3 only has to have a higher magnetic permeability and a higher saturation magnetic flux density than the magnetic member 1. Thus, soft ferrite, permalloy, permendur, silicon steel, an amorphous magnetic alloy, a nano-crystal magnetic alloy, and Sendust can also be used in addition to a cold rolled steel sheet.

A soft magnetic member 3 obtained by processing a soft magnetic material into particulate form and causing a plastic material or the like to contain the soft magnetic material, can also be used. Such a soft magnetic member 3 obtained by using a plastic material is characterized by being able to be easily formed into any shape through injection molding or the like.

Figure 12:
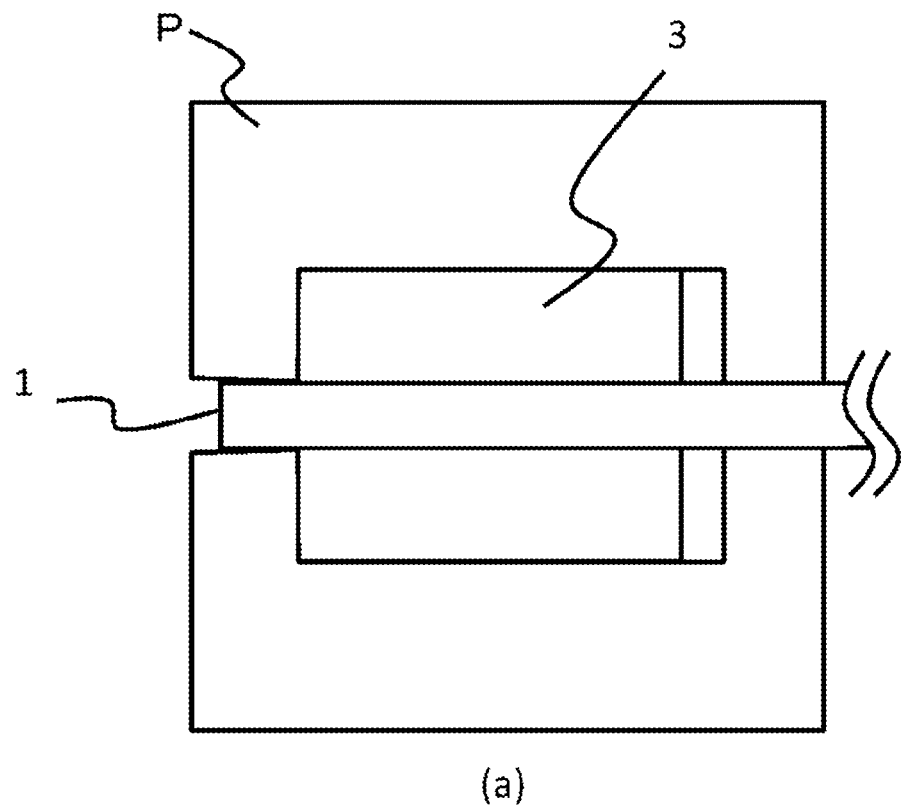
FIG. 12 is a diagram for explaining attachment of the soft magnetic members in embodiment 1.
Figure 12:
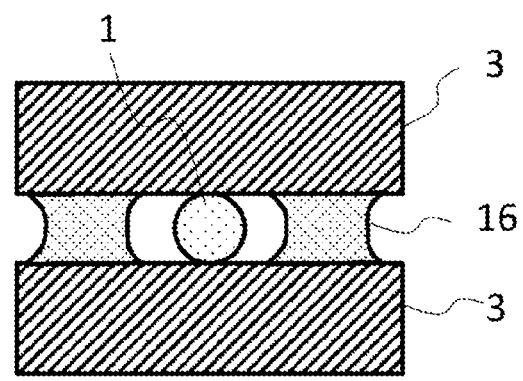
Figure 13:
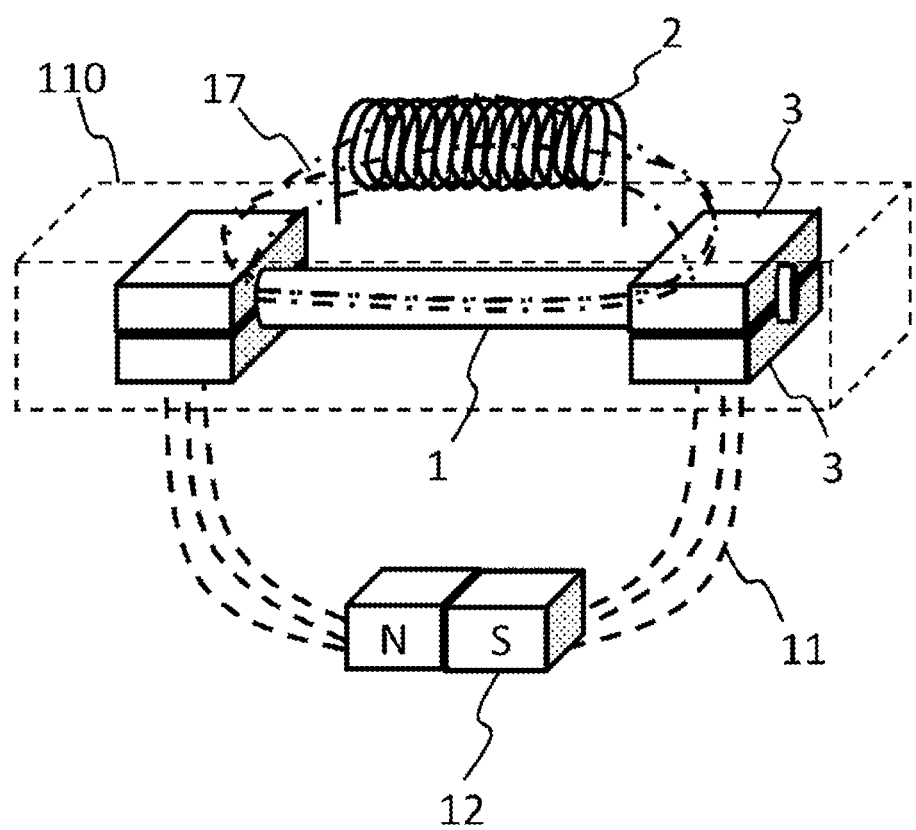
FIG. 13 is a schematic view showing a configuration of a power generation element according to embodiment 1.

The present embodiment 1 employs a configuration in which the soft magnetic members 3 which each have the shape of a block and in which the grooves 15 each having a cross section with a V shape are formed, are disposed on the upper and lower sides. However, each groove 15 only has to have a cross-sectional shape that allows the soft magnetic member 3 to be fitted to the magnetic member 1 such that the magnetic member 1 is disposed at the predetermined position. In addition to a V shape, a quadrangular shape, a semicircular shape, and a semi-elliptical shape can also be used. If, for example, the magnetic member 1 has the shape of a sheet, the groove 15 is not always needed. Specifically, two soft magnetic members 3 in which no grooves 15 are formed can also stably hold the magnetic member 1 at flat surfaces of the soft magnetic members 3 as shown in FIG. 12 (b), by: disposing the magnetic member 1 and the soft magnetic members 3 at predetermined positions by means of jigs P as shown in FIG. 12(a); and applying and curing the adhesive 16.

Although the type of the adhesive for adhering the two soft magnetic members 3 disposed on the upper and lower sides to each other is not particularly limited, an anaerobic curable adhesive or a curable adhesive obtained by combining an anaerobic curable adhesive and another curable adhesive is suitable in consideration of ease of handling the adhesive and a short curing time. Instead of these adhesives, a heat-curable adhesive, a curing agent-mixed adhesive, an ultraviolet-curable adhesive, a heat-melting adhesive, or an adhesive for which these curing means are combined, can also be used.

Further, if the jigs for fixing, from outside, the soft magnetic members 3 disposed on the upper and lower sides are used, the two soft magnetic members 3 can be pressed against each other to hold the magnetic member 1. Regarding means for pressing the soft magnetic members 3 against each other to hold the magnetic member 1, the soft magnetic members 3 may be joined together through crimping. Instead of crimping, adhesive tape, press-fit, riveting, pressure contact, welding, brazing, snap fit, or the like can be used.

Although a copper wire with an insulation coating thereon has been used as the electrically conductive wire of the power generation coil 2 in the present embodiment 1, the same level of electrical conductivity only has to be ensured, and a wire made of aluminum, gold, silver, a copper alloy, or an aluminum alloy can also be used.

Further, although a wire material having a wire diameter of 0.02 mm to 0.05 mm is used as the electrically conductive wire of the power generation coil 2, the wire diameter is not limited thereto, and a wire diameter of the electrically conductive wire forming the power generation coil 2 can be selected on the basis of the diameter of the magnetic member 1 around which the wire material is wound, the size of the power generation element 100, and the like.

Although the electrically conductive wire has been wound around the bobbin in order to form the power generation coil 2, the manner of the formation is not limited thereto. The electrically conductive wire may also be wound around a jig/tool, fixed by using an adhesive and a self-fusion wire, detached from the jig/tool, and used as the power generation coil 2.

Regarding the arrangement position of the power generation coil 2, the power generation coil 2 is preferably disposed so as to enclose the magnetic member 1 as shown in FIG. 1, such that magnetic flux is maximally changed by the large Barkhausen effect of the magnetic member 1. However, as shown in a configuration diagram of a power generation element 110 in FIG. 13, the power generation coil 2 may be disposed along the magnetic member 1 without enclosing the magnetic member 1, such that magnetic fields 17 generated by the magnetic member 1 pass through the power generation coil 2.

Permanent magnets are preferably used as the magnetic field generation source 12. However, the magnetic field generation source 12 only has to stably generate magnetic fields 11, and an electromagnet can also be used.

A ferrite magnet, a neodymium magnet, an alnico magnet, or a rare-earth magnet such as a samarium cobalt magnet can be used as the permanent magnet. Alternatively, a magnet obtained by causing a plastic material to contain magnetic material particles and molding the plastic material through injection molding or the like, can also be used.

Figure 14:
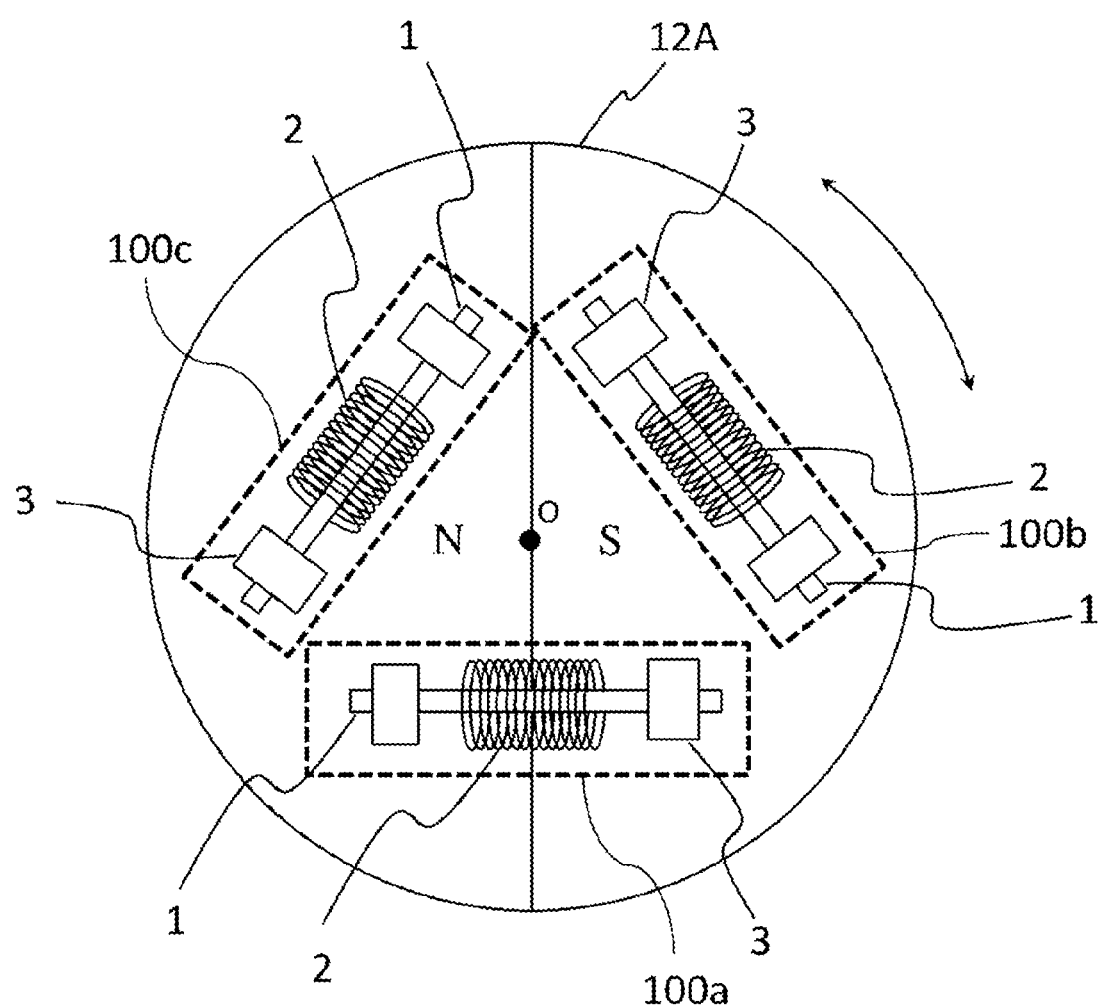
FIG. 14 is a schematic view showing a configuration of power generation elements according to embodiment 1.

Regarding the configuration of the power generation element, a case has been described in which the one set of power generation element 100 composed of the magnetic member 1, the power generation coil 2, and the soft magnetic members 3 is provided for the one magnetic field generation source 12, as shown in FIG. 1. However, three sets of power generation elements 100a, 100b, and 100c may be provided for one magnetic field generation source 12A, as shown in FIG. 14. The magnetic field generation source 12A has the shape of a disc, and the power generation elements 100a to 100c are disposed above the magnetic field generation source 12A so as to be apart from the magnetic field generation source 12A. The magnetic field generation source 12A is rotated about a point O. It is noted that FIG. 14 merely shows an example of the manner of arrangement, and the manner is not limited to the example.

<Characteristics of Power Generation Element>

In the power generation element 100, 110 described in the present embodiment 1, the soft magnetic members 3 are disposed so as to be in contact with and press the magnetic member 1 which causes the large Barkhausen effect, whereby the magnetic resistance between the magnetic member 1 and each soft magnetic member 3 can be set to be low. Consequently, magnetic fields 11 applied by the magnetic field generation source 12 can be stably directed to the magnetic member 1. Thus, reversal of the magnetization direction due to the large Barkhausen effect can be stabilized, and electromotive force can be stably generated from the power generation coil 2 owing to electromagnetic induction.

By using the power generation element 100 which stably generates electromotive force, the electromotive force generated in the power generation element 100 can be used as power for driving an IC.

In addition, by making use of the fact that fluctuation of the magnetic fields 11 caused by the large Barkhausen effect is sharp and that electric power generated from the power generation coil 2 owing to electromagnetic induction takes a pulse form, a magnetic sensor for reporting generation of the magnetic fields 11 on the basis of the pulse voltage can be obtained.

Figure 15:
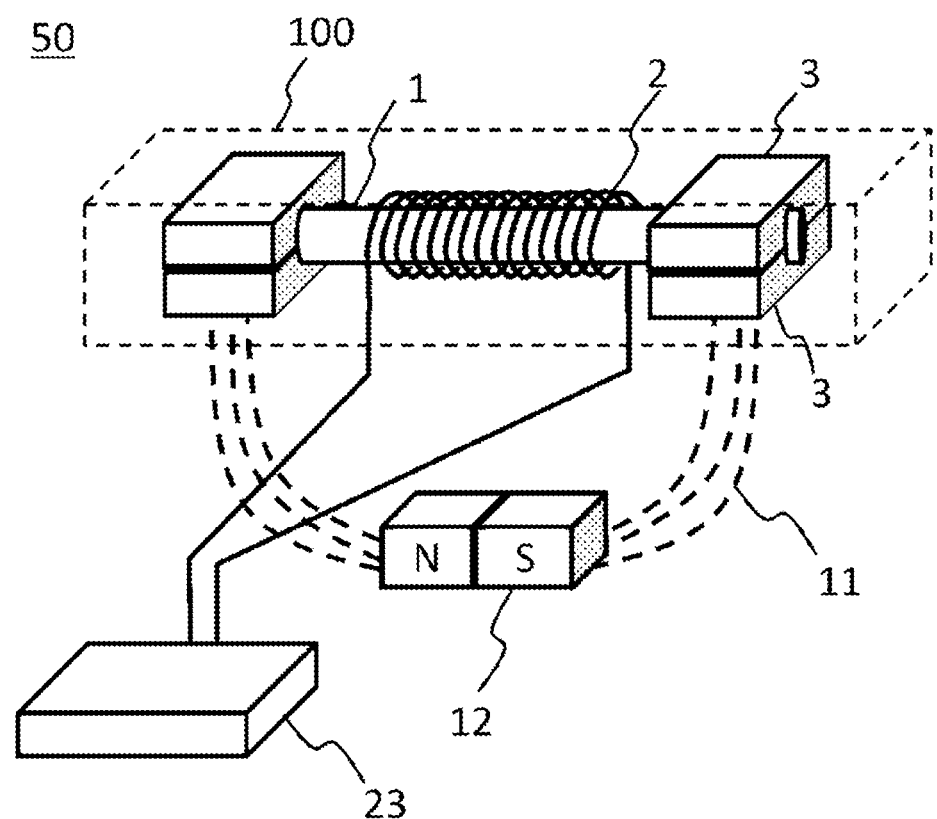
FIG. 15 is a diagram for explaining an unpowered magnetic sensor in embodiment 1.

Further, by making use of the characteristics, i.e., the pulse and stable supply of power in the power generation element 100, it is possible to obtain, as shown in FIG. 15, an unpowered magnetic sensor 50 in which: combination with the power generation element 100, an IC 23, and the like is performed; the IC 23 is operated by using, as power, the electric power generated in a pulse form in the power generation element 100; and generation of the pulse in the power generation element 100 is simultaneously detected by the IC 23. It is also possible to obtain a reflective optical encoder 200, a schematic cross-sectional view of which is shown in FIG. 16.

Figure 16:
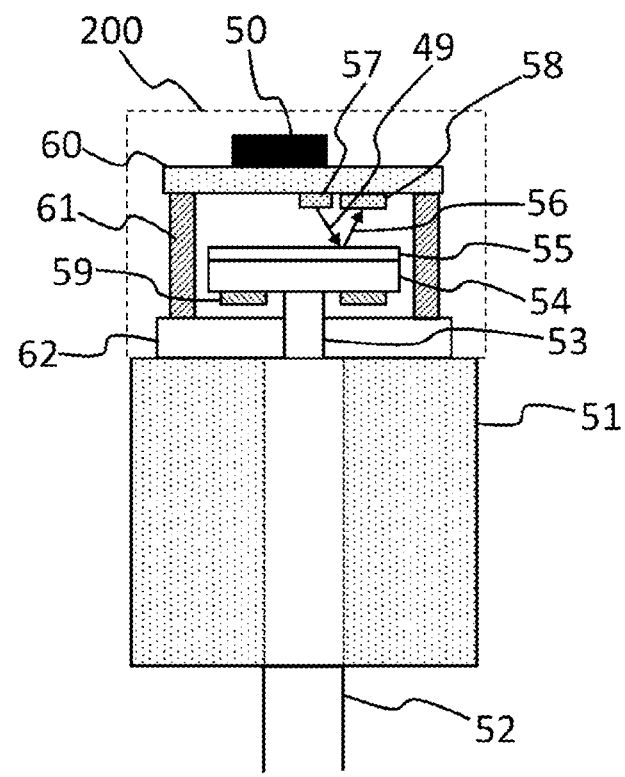
FIG. 16 is a schematic cross-sectional view of a reflective optical encoder according to embodiment 1.

FIG. 16 is a schematic view showing a cross-sectional configuration of the reflective optical encoder 200.

The reflective optical encoder 200 is attached to a motor 51. A rotation shaft 53 is connected coaxially with a motor rotation shaft 52 of the motor 51, and a hub member 54 on which a disc-shaped scale plate 55 is attached, is fixed to the rotation shaft 53.

The surroundings of the scale plate 55 are covered by: a substrate 60; a housing 61 disposed around the scale plate 55; and a housing 62 which the rotation shaft 53 penetrates. The unpowered magnetic sensor 50 is disposed on the outer surface of the substrate 60, and a light projecting portion 57 for emitting irradiation light indicated by an arrow 49 and a light receiving portion 58 for receiving reflected light indicated by an arrow 56 are disposed on the inner surface of the substrate 60.

Magnetism is imparted to the hub member 54. Magnets 59 are fixed to the back surface of the hub member 54 in order to impart magnetism to the hub member 54. Alternatively, the magnets 59 can also be disposed between the disc-shaped scale plate 55 and the hub member 54. In this case, the need for a step of fixing the hub member 54 and the magnets 59 to each other can be eliminated, whereby improvement of manufacturing efficiency can be achieved. Further, if each magnet 59 is formed into the shape of the hub member 54, the magnet 59 has a function of the hub member 54. Consequently, the number of components composing the reflective optical encoder 200 can be reduced, whereby manufacturing efficiency can be improved.

Regarding materials of the hub member 54, the hub member 54 can be formed by dispersing magnetic particles on a plastic material or the like. The hub member 54 can be easily made into various shapes through injection molding.

No limitation to the configuration in which the hub member 54 is formed by dispersing magnetic particles on a plastic material or the like, is imposed. The hub member 54 may be formed from ferrite, alnico (Al—Ni—Co), or a rare earth.

In the reflective optical encoder 200, when the rotation shaft 53 is rotated, irradiation light emitted from the light projecting portion 57 is reflected by a pattern that is formed on the scale plate 55 and that is composed of a high-reflection portion having a high light reflectivity and a low-reflection portion having a low light reflectivity. Then, a change in the amount of the reflected light is detected by the light receiving portion 58, whereby a rotation angle and a rotation speed are detected. Further, the power generation element 100 generates electricity according to a change in the direction of magnetic force outputted from the hub member 54, whereby the number of times of rotation performed from a reference position is detected. Since the rotation shaft 53 is rotated together with the motor rotation shaft 52 of the motor 51, the reflective optical encoder 200 can detect the rotation angle, the number of times of rotation, and the rotation speed of the motor 51 by detecting the rotation angle, the number of times of rotation, and the rotation speed of the rotation shaft 53.

Embodiment 2

A basic structure of a power generation element 100 described in the present embodiment 2 is the same as that in embodiment 1, but the power generation element 100 is different in terms of the structure in which the magnetic member 1 is disposed so as to be pressed by the soft magnetic member 3.

Figure 17:
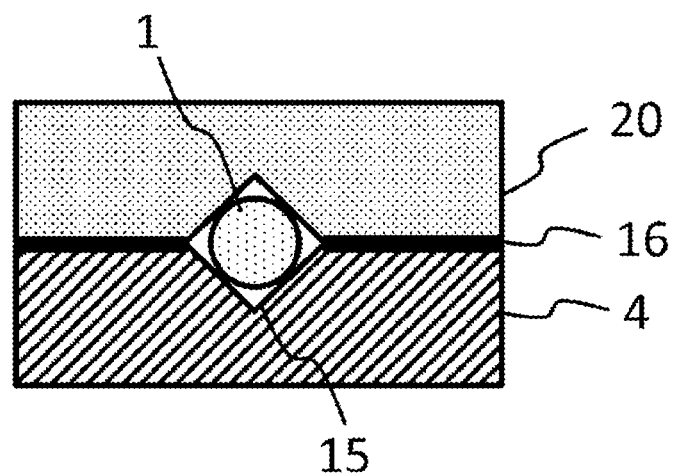
FIG. 17 is a cross-sectional view of a soft magnetic member in embodiment 2.

FIG. 17 is a cross-sectional view, taken in the direction perpendicular to the magnetic member 1, of a portion at which a soft magnetic member 4 is attached to the magnetic member 1 of the power generation element 100.

In the structure in which the soft magnetic members 3 are disposed in embodiment 1 as shown in FIG. 2, the two soft magnetic members 3 each having the shape of a block are pressed against each other to hold the magnetic member 1. Meanwhile, in a structure in which the soft magnetic member 4 is disposed as shown in FIG. 17, the magnetic member 1 is pressed by: the soft magnetic member 4 in which a groove 15 is formed and which has the shape of a block; and a non-magnetic member 20 in which a groove 15 is formed in the same manner as in the soft magnetic member 4 and which has the shape of a block. The soft magnetic member 4 and the non-magnetic member 20 are fixed by means of the adhesive 16, to hold the magnetic member 1.

Here, regarding the shape of each groove 15 and the type of the adhesive 16, any groove 15 and any adhesive 16 can be used as long as the groove 15 has a shape that enables the soft magnetic member 4 to press and hold the magnetic member 1 and the adhesive 16 is made from a material that enables the soft magnetic member 4 to press and hold the magnetic member 1, in the same manner as in embodiment 1.

The magnetic member 1 can be pressed and held by the non-magnetic member 20 and the soft magnetic member 4, and the magnetic member 1 and the soft magnetic member 4 can be brought into stable contact with each other. Thus, change in the magnetization direction due to the large Barkhausen effect caused by the magnetic member 1 can be stabilized, and power generation characteristics that experience little fluctuation can be obtained.

In addition, it becomes possible to apply the power generation element 100 to magnetic sensors and encoders.

Embodiment 3

A basic structure of a power generation element 100 described in the present embodiment 3 is the same as that in embodiment 1, but the power generation element 100 is different in terms of the structure in which the magnetic member 1 is disposed so as to be pressed by the soft magnetic member 3.

Figure 18:
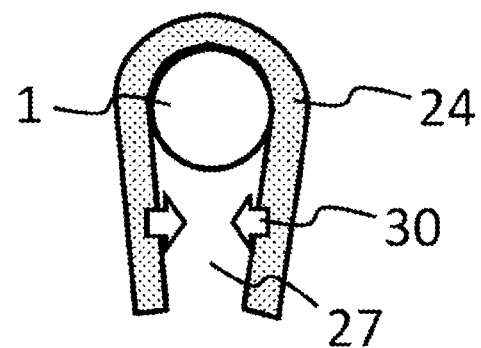
FIG. 18 is a cross-sectional view of a soft magnetic member in embodiment 3.

FIG. 18 is a cross-sectional view, taken in the direction perpendicular to the magnetic member 1, of a portion at which a soft magnetic member 24 is attached to the magnetic member 1 of the power generation element 100.

In the structure in which the soft magnetic members 3 are disposed in embodiment 1 as shown in FIG. 2, the two soft magnetic members 3 each having the shape of a block are pressed against each other to hold the magnetic member 1. Meanwhile, in a structure in which the soft magnetic member 24 is disposed as shown in FIG. 18, the soft magnetic member 24 having a U shape is used to press the magnetic member 1 into a fitting groove 27 which is an inner portion of the U shape, so that the magnetic member 1 is fixed and held. The U shape is formed such that the inner diameter of an inner bottom portion of the U shape is equal to or smaller than the outer diameter of the magnetic member 1. The U shape is formed such that the distance between both tips of end portions of the U shape is shorter than the diameter of the bottom portion. Therefore, when the magnetic member 1 is fitted into the fitting groove 27 by using elastic force of the soft magnetic member 24, the fitting groove 27 is widened, and, after the fitting, the magnetic member 1 is pressed by elastic force of the soft magnetic member 24 as schematically indicated by arrows 30.

Figure 19:
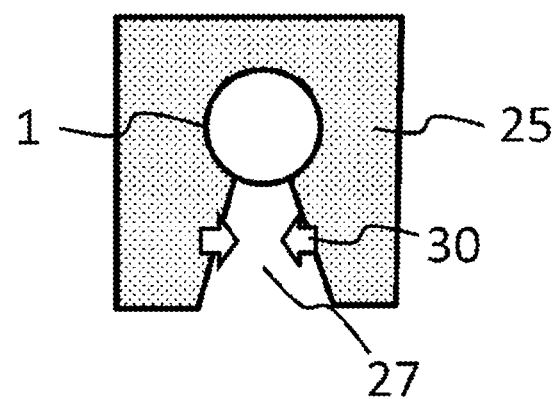
FIG. 19 is a cross-sectional view of a soft magnetic member in embodiment 3.

Here, any fitting groove 27 can be used as long as the fitting groove 27 has a shape that enables the soft magnetic member 24 to press and hold the magnetic member 1 and the fitting groove 27 is made from a material that enables the soft magnetic member 24 to press and hold the magnetic member 1. For example, a soft magnetic member 25 having the shape of a block can also be used with a fitting groove 27 being formed therein, as shown in FIG. 19. In this case, the fitting groove 27 is formed such that the inner diameter of a bottom portion of the fitting groove 27 is smaller than the outer diameter of the magnetic member 1.

The soft magnetic member 24, 25 presses and holds the magnetic member 1 by elastic force as indicated by the arrows 30, whereby the magnetic member 1 and the soft magnetic member 24, 25 can be brought into stable contact with each other. Thus, change in the magnetization direction due to the large Barkhausen effect caused by the magnetic member 1 can be stabilized, and power generation characteristics that experience little fluctuation can be obtained.

In addition, it becomes possible to apply the power generation element 100 to magnetic sensors and encoders.

Embodiment 4

A basic structure of a power generation element 100 described in the present embodiment 4 is the same as that in embodiment 1, but the power generation element 100 is different in terms of the structure in which the magnetic member 1 is disposed so as to be pressed by the soft magnetic member 3.

Figure 20:
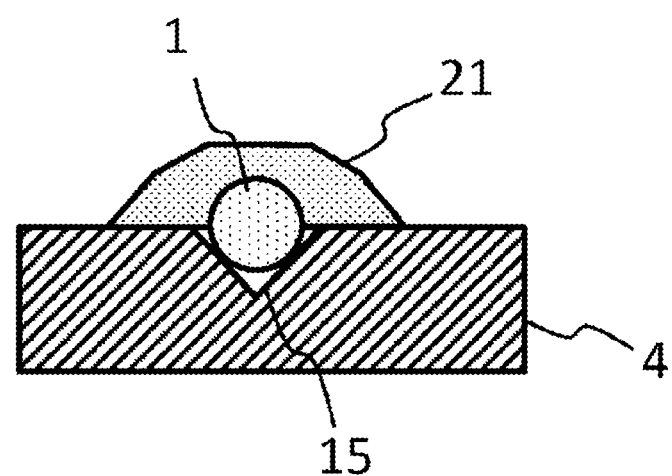
FIG. 20 is a cross-sectional view of a soft magnetic member in embodiment 4.

FIG. 20 is a cross-sectional view, taken in the direction perpendicular to the magnetic member 1, of a portion at which a soft magnetic member 4 is attached to the magnetic member 1 of the power generation element 100.

In the structure in which the soft magnetic members 3 are disposed in embodiment 1 as shown in FIG. 2, the two soft magnetic members 3 each having the shape of a block are pressed against each other to hold the magnetic member 1. Meanwhile, in a structure in which the soft magnetic member 4 is disposed as shown in FIG. 20, the magnetic member 1 is pressed by an adhesive 21 and the soft magnetic member 4 in which a groove 15 is formed and which has the shape of a block, so that the magnetic member 1 is fixed and held.

Figure 21:
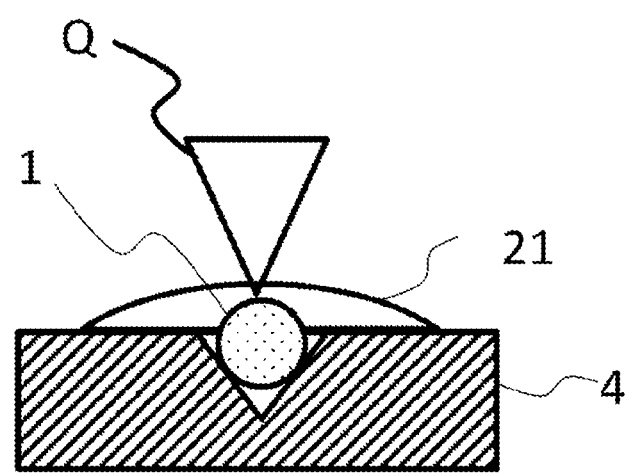
FIG. 21 is a diagram for explaining a manner of holding the magnetic member, in embodiment 4.
Figure 22:
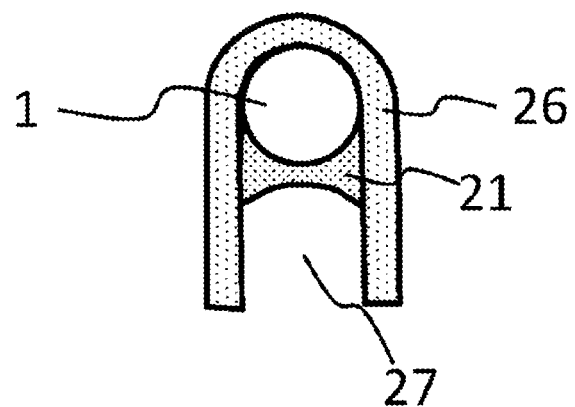
FIG. 22 is a cross-sectional view of a soft magnetic member in embodiment 4.

Here, regarding the shape of the groove 15 and the type of the adhesive 21, any groove 15 and any adhesive 21 can be used as long as the groove 15 has a shape that enables the soft magnetic member 4 to press and hold the magnetic member 1 and the adhesive 21 is made from a material that enables the soft magnetic member 4 to press and hold the magnetic member 1, in the same manner as in embodiment 1. For example, in the case of FIG. 20, the adhesive 21 shrinks upon curing, and the magnetic member 1 can be pressed against a wall surface of the groove in the soft magnetic member 4. It is noted that the magnetic member 1 may be held in a state of being pressed against the soft magnetic member 4 by applying and curing the adhesive 21 in a state where the magnetic member 1 is pressed against the soft magnetic member 4 by means of a jig Q, as in FIG. 21. Alternatively, the following structure may be employed as shown in FIG. 22. That is, a fitting groove 27 which is an inner portion having a U shape is formed in a soft magnetic member 26 having a U shape, and the magnetic member 1 which has been fitted into the fitting groove 27, is held and pressed by means of the adhesive 21.

The soft magnetic member 4, 26 presses and holds the magnetic member 1 by means of the adhesive 21, whereby the magnetic member 1 and the soft magnetic member 4, 26 can be brought into stable contact with each other. Thus, change in the magnetization direction due to the large Barkhausen effect caused by the magnetic member 1 can be stabilized, and power generation characteristics that experience little fluctuation can be obtained.

In addition, it becomes possible to apply the power generation element 100 to magnetic sensors and encoders.

Embodiment 5

A basic structure of a power generation element 100 described in the present embodiment 5 is the same as that in embodiment 1, but the power generation element 100 is different in terms of the structure in which the soft magnetic member 3 is attached to the magnetic member 1.

Figure 23:
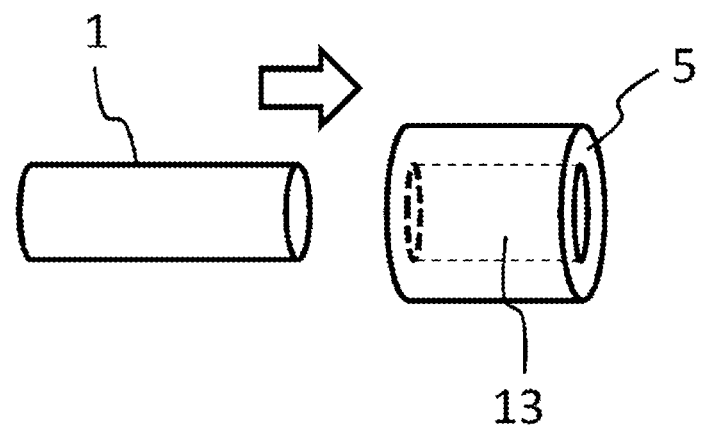
FIG. 23 is a perspective view for explaining a manner of attaching a soft magnetic member in embodiment 5.

FIG. 23 is a perspective view for explaining a portion at which a soft magnetic member 5 is disposed on the magnetic member 1 of the power generation element 100.

In the present embodiment 5, the soft magnetic member 5 has a columnar shape and is provided with an insertion hole 13 which penetrates the soft magnetic member 5 between the top surface and the bottom surface thereof each having a circular shape. The magnetic member 1 which causes the large Barkhausen effect is press-fitted into the insertion hole 13, and the magnetic member 1 is pressed and fixed by the soft magnetic member 5 having a columnar shape.

Figure 24:
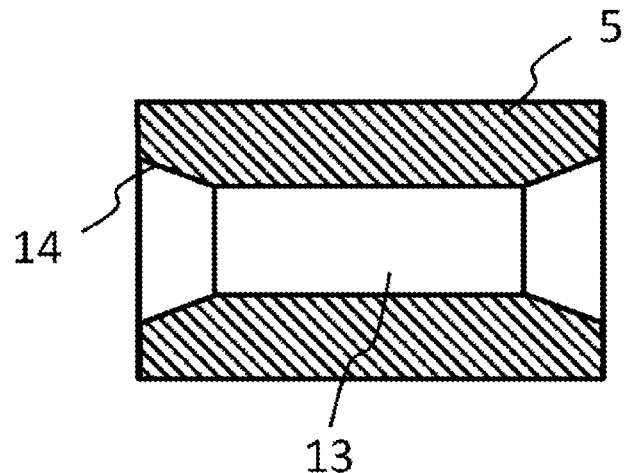
FIG. 24 is a cross-sectional view of the soft magnetic member in embodiment 5.

FIG. 24 shows a cross-sectional structure obtained when the soft magnetic member 5 (shown in FIG. 23) which has a columnar shape and which is provided with the insertion hole 13, is cut along the insertion hole 13 from top surface toward the bottom surface.

As shown in FIG. 24, tapered portions 14 are formed on the top surface side and the bottom surface side of the insertion hole 13 of the soft magnetic member 5 such that opening portions of the insertion hole 13 are upsized toward the outer sides from a center portion of the insertion hole 13.

The magnetic member 1 is formed such that the outer diameter thereof is larger than the inner diameter defined by the insertion hole 13 formed in the soft magnetic member 5. In the present embodiment 5, a fitting tolerance which is the difference between the inner diameter defined by the insertion hole 13 of the soft magnetic member 5 and the outer diameter of the magnetic member 1 is preferably set to +50 microns or smaller from the viewpoint of workability and the strength of fixation resulting from pressing.

By press-fitting the magnetic member 1 into the insertion hole 13 of the soft magnetic member 5, the magnetic member 1 can be disposed so as to be pressed through interference-fit. The interference-fit step can employ not only press-fit but also: shrink-fit in which heating is performed to expand the insertion hole 13, and the magnetic member 1 is fitted thereinto; or the like.

As described in the present embodiment 5, the soft magnetic member 5 and the magnetic member 1 are fitted to each other so that the soft magnetic member 5 is in contact with and presses the magnetic member 1. Consequently, the magnetic resistance between the magnetic member 1 and the soft magnetic member 5 can be reduced. Therefore, magnetic fields 11 can be stably applied to the magnetic member 1 by the magnetic field generation source 12.

As a result of the above circumstances, change in the magnetization direction due to the large Barkhausen effect can be stabilized, and electromotive force can be stably generated by the power generation coil 2 owing to electromagnetic induction.

In the case where the magnetic member 1 is press-fitted into the soft magnetic member 5, the tapered portions 14 are preferably provided to the insertion hole 13 of the soft magnetic member 5 as described above in order to efficiently perform insertion work. If the tapered portions 14 are provided, the efficiency of performing the insertion work through press-fit can be improved, and a power generation element in which electromotive force can be stably generated can be obtained.

In addition, it becomes possible to apply the power generation element 100 to magnetic sensors and encoders.

Embodiment 6

Soft magnetic members 6 used in the present embodiment 6 are characterized in that each soft magnetic member 6 is formed not only from a soft magnetic material such as soft ferrite or permalloy, rather, the soft magnetic member 6 is obtained by processing the soft magnetic material into a fine particulate form so as to make soft magnetic material particles and adding the soft magnetic material particles onto a plastic material formed from an adhesive or the like.

Figure 25:
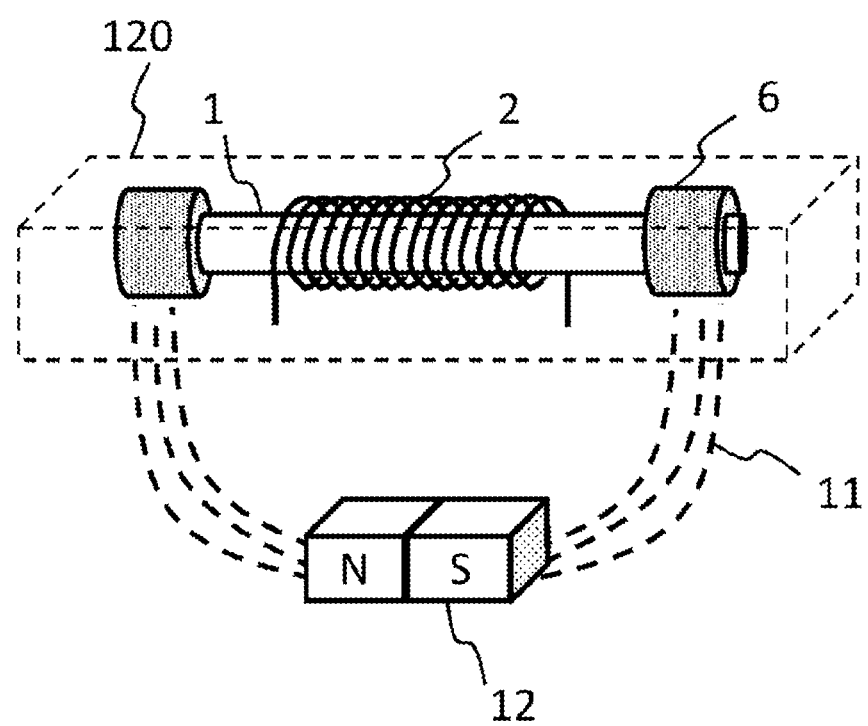
FIG. 25 is a schematic view showing a configuration of a power generation element according to embodiment 6.

FIG. 25 is a schematic view of a power generation element 120 according to the present embodiment 6. The basic configuration thereof is the same as those in embodiment 1 and the like. That is, the power generation coil 2 made of an electrically conductive wire is disposed around the magnetic member 1, and the soft magnetic members 6 are attached to both respective end portions of the magnetic member 1.

For each soft magnetic member 6, soft ferrite is processed to obtain particles with diameters not larger than 5 microns, and the particles are added onto a plastic material. The plastic material onto which the soft ferrite particles have been added can be processed, by using a molding device, into a shape that enables the plastic material to be attached to a corresponding one of both end portions of the magnetic member 1. For example, if the plastic material is processed into a columnar shape that has an insertion hole 13 therein and that is the same as the shape of the soft magnetic member 5 (FIG. 23) described in embodiment 5, the plastic material can be easily attached to the corresponding one of both end portions of the magnetic member 1.

Although soft ferrite is used as the soft magnetic material that is to take particulate form and that is to be added onto a plastic material in the present embodiment 6, the soft magnetic material is not limited thereto, and any material can be used in the same manner as long as the material can be processed into particulate form. Specifically, permalloy, silicon steel, or the like can be used.

As the plastic material onto which the soft magnetic material in particulate form is to be added, a heat-curable plastic material, a curing agent-mixed plastic material, an ultraviolet-curable plastic material, an anaerobic curable plastic material, a heat-melting plastic material, or a curable plastic material obtained by combining these plastic materials can be used. However, an ultraviolet-curable plastic material or a plastic material obtained by combining another curable plastic material and an ultraviolet-curable plastic material which require short times to be cured, is suitable from the viewpoint of simplicity of handling and curing methods.

In the present embodiment 6, plastic materials onto which a soft magnetic material in particulate form has been added are molded to obtain the soft magnetic members 6, and the soft magnetic members 6 are attached through fitting to both end portions of the magnetic member 1 without any gaps therebetween. Since the magnetic member 1 which causes the large Barkhausen effect is in contact with and pressed by the soft magnetic members 6, magnetic fields 11 can be stably applied to the magnetic member 1. Thus, change in the magnetization direction due to the large Barkhausen effect can be stabilized, and electromotive force can be stably generated by the power generation coil 2 owing to electromagnetic induction.

In addition, it becomes possible to apply the power generation element 120 to magnetic sensors and encoders.

Embodiment 7

Figure 26:
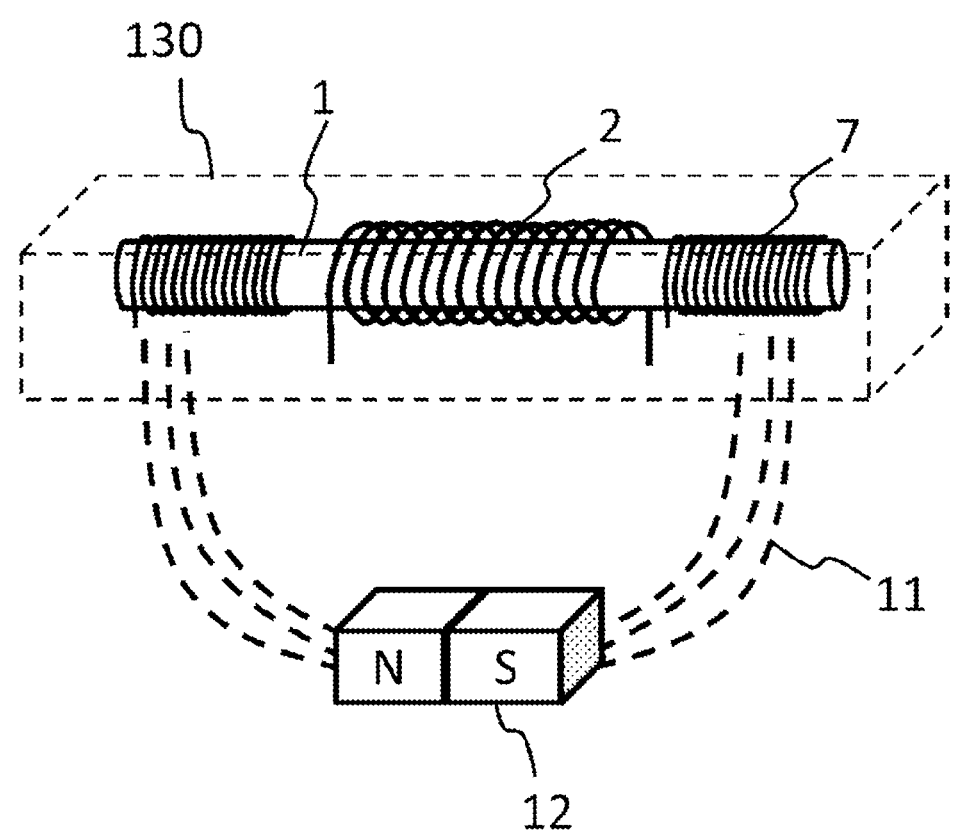
FIG. 26 is a schematic view showing a configuration of a power generation element according to embodiment 7.

A power generation element 130 according to the present embodiment 7 is characterized in that soft magnetic members 7 are used as shown in a schematic view of FIG. 26, each soft magnetic member 7 being obtained by: making a soft magnetic material such as soft ferrite or permalloy into the form of a wire; and winding the wire around the magnetic member 1.

If the soft magnetic member 7 obtained by the winding is, during processing thereof, formed such that the inner diameter of the soft magnetic member 7 is smaller than the outer diameter of the magnetic member 1, the magnetic member 1 can be disposed so as to be pressed by the soft magnetic member 7 at the time of attachment to the magnetic member 1.

Since the soft magnetic member 7 obtained by the winding is disposed so as to press the magnetic member 1 which causes the large Barkhausen effect, the magnetic resistance between the soft magnetic member 7 and the magnetic member 1 can be kept low, and magnetic fields 11 from the magnetic field generation source 12 can be stably applied to the magnetic member 1. Therefore, change in the magnetization direction due to the large Barkhausen effect can be stabilized, and stable electromotive force can be generated by the power generation coil 2 owing to electromagnetic induction.

In addition, it becomes possible to apply the power generation element 130 to magnetic sensors and encoders.

In the power generation element 100, 110, 120 described in embodiments 1 to 6, when heat is applied to the power generation element 100, 110, 120 from outside and the temperature of the magnetic member 1 becomes high, if there is a significant difference in thermal expansion coefficient between the magnetic member 1 and the soft magnetic member 3 having the shape of a block or the like, great stress is applied to the magnetic member 1 at high temperature so that magnetic characteristics of the magnetic member 1 are changed. As a result, change in the magnetization direction due to the large Barkhausen effect might be reduced.

In addition, a gap might be generated between the magnetic member 1 and the soft magnetic member 3 having the shape of a block or the like, whereby the magnetic resistance therebetween is increased, and unevenness occurs in magnetic fluxes that pass through the magnetic member 1 owing to magnetic fields 11 generated from the magnetic field generation source 12. As a result, the advantageous effects of using the soft magnetic member 3 or the like are not exhibited, and there is a case where stable electromotive force is unable to be obtained in the same manner as in the case where the soft magnetic member 3 or the like is not used.

In the case where the soft magnetic member 7 is used so as to be wound as in the present embodiment 7, even if there is a difference in thermal expansion coefficient between the soft magnetic member 7 and the magnetic member 1, stress to be applied to the magnetic member 1 can be reduced also at high temperature. Therefore, a state where the soft magnetic member 7 is pressed against and holds the magnetic member 1 can be maintained. Consequently, the magnetic resistance therebetween can be reduced, and stable magnetic fields 11 can be caused to pass through the magnetic member 1, whereby stable electromotive force can be generated by the power generation coil 2.

In addition, it becomes possible to apply the power generation element 130 to magnetic sensors and encoders.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 magnetic member
2 power generation coil
3 soft magnetic member
4 soft magnetic member
5 soft magnetic member
6 soft magnetic member
7 soft magnetic member
8A magnetic flux density
8B magnetic flux density
8C magnetic flux density
9A electromotive force
9B electromotive force
9C electromotive force
10 arrow
11 magnetic field
12, 12A magnetic field generation source
13 insertion hole
14 tapered portion
15 groove
16 adhesive
17 magnetic field
18 gap
20 non-magnetic member
21 adhesive
22 magnetic member
23 IC
24 soft magnetic member
25 soft magnetic member
26 soft magnetic member
27 fitting groove
30 arrow
49 arrow
50 unpowered magnetic sensor
51 motor
52 motor rotation shaft
53 rotation shaft
54 hub member
55 scale plate
56 arrow
57 light projecting portion
58 light receiving portion
59 magnet
60 substrate
61 housing
62 housing
100, 100a, 100b, 100c power generation element
110 power generation element
120 power generation element
130 power generation element
200 reflective optical encoder

The invention claimed is:

1. A power generation element comprising:
a magnetic member having different coercivities between an outer peripheral portion thereof and a center portion thereof, and configured to cause a large Barkhausen effect;
a power generation coil disposed so as to be wound around the magnetic member; and
soft magnetic members formed at both end portions of the magnetic member so as to be in contact with the magnetic member and so as to press the magnetic member.

2. The power generation element according to claim 1, wherein
the soft magnetic members have insertion holes penetrating therethrough, and
both end portions of the magnetic member are press-fitted into the respective insertion holes.

3. The power generation element according to claim 2, wherein each insertion hole defines a larger inner diameter at an opening portion thereof than at a center portion thereof.

4. The power generation element according to claim 2, wherein the magnetic member is press-fitted into the soft magnetic members through interference-fit.

5. The power generation element according to claim 2, wherein the magnetic member is press-fitted into the soft magnetic members through shrink-fit.

6. The power generation element according to claim 1, wherein the soft magnetic members are formed into shapes that enable the soft magnetic members to press, at facing surfaces thereof, the magnetic member.

7. The power generation element according to claim 6, wherein
the soft magnetic members are formed into shapes of blocks facing each other with the magnetic member interposed therebetween,
grooves each having a diameter smaller than an outer diameter of the magnetic member are formed at portions, of the facing surfaces, that press the magnetic member, and
the facing surfaces other than the grooves are in contact with each other.

8. The power generation element according to claim 7, wherein the facing surfaces in contact with each other have been adhered to each other by using an adhesive.

9. The power generation element according to claim 6, wherein
each soft magnetic member has a cross section with a U shape, and
an inner diameter of a bottom portion of the U shape is equal to or smaller than an outer diameter of the magnetic member.

10. The power generation element according to claim 9, wherein
the U shape is formed such that a distance between both tips of end portions of the U shape is shorter than the diameter of the bottom portion of the U shape, and
the magnetic member is pressed by elastic force exerted when the magnetic member is inserted between both tips of the end portions.

11. The power generation element according to claim 1, wherein
each soft magnetic member is disposed so as to face a non-magnetic member with the magnetic member interposed therebetween, and
the magnetic member is pressed by a surface of the soft magnetic member and a surface of the non-magnetic member.

12. The power generation element according to claim 11, wherein
the soft magnetic member and the non-magnetic member are each formed into a shape of a block,
grooves each having a diameter smaller than an outer diameter of the magnetic member are formed at portions, of the blocks, that press the magnetic member, and
facing surfaces of the blocks other than the grooves are in contact with each other.

13. The power generation element according to claim 1, wherein each soft magnetic member is wound around the magnetic member.

14. The power generation element according to claim 1, wherein each soft magnetic member has a structure in which soft magnetic material particles have been dispersed on a plastic material.

15. The power generation element according to claim 1, wherein each soft magnetic member is made of a cold rolled steel sheet.

16. The power generation element according to claim 1, wherein each soft magnetic member is made of soft ferrite.

17. A magnetic sensor comprising:
the power generation element according to claim 1; and
a magnetic field generation source configured to apply a magnetic field to the magnetic member.

18. An encoder comprising:
the power generation element according to claim 1; and
a magnetic field generation source configured to apply a magnetic field to the magnetic member.

19. A motor comprising
the encoder according to claim 18.

20. A power generation element comprising:
a magnetic member having different coercivities between an outer peripheral portion thereof and a center portion thereof, and configured to cause a large Barkhausen effect;
a power generation coil disposed along the magnetic member; and
soft magnetic members formed at both end portions of the magnetic member so as to be in contact with the magnetic member and so as to press the magnetic member.

* * * * *